United States Patent [19]

Miyashita et al.

[11] Patent Number: 5,589,421
[45] Date of Patent: Dec. 31, 1996

[54] METHOD OF MANUFACTURING ANNEALED FILMS

[75] Inventors: Naoto Miyashita, Yokohama; Koichi Takahashi, Kawasaki; Mitsutoshi Koyama, Tokyo; Shinji Nunotani, Yokohama; Satoshi Yanagiya, Kawasaki; Yoshiro Baba, Yokohama, all of Japan

[73] Assignee: Kabushiki Kaisha Toshiba, Kawasaki, Japan

[21] Appl. No.: 300,067

[22] Filed: Sep. 1, 1994

Related U.S. Application Data

[62] Division of Ser. No. 98,245, Jul. 29, 1993, abandoned, which is a continuation of Ser. No. 732,762, Jul. 19, 1991, abandoned.

[30] Foreign Application Priority Data

Jul. 20, 1990 [JP] Japan .................................. 2-192100
Mar. 19, 1991 [JP] Japan .................................. 3-080688

[51] Int. Cl.$^6$ ........................ H01L 21/302; H01L 21/463
[52] U.S. Cl. .......................................................... 437/225
[58] Field of Search ................................. 118/715, 719, 118/724, 725; 437/225

[56] References Cited

U.S. PATENT DOCUMENTS

| | | | |
|---|---|---|---|
| 4,723,363 | 12/1986 | Seelbach et al. | 34/9 |
| 4,753,192 | 6/1988 | Goldsmith et al. | 118/715 |
| 4,760,244 | 7/1988 | Hokynar | 118/724 |
| 4,763,602 | 8/1988 | Madan et al. | 118/719 |
| 4,802,441 | 2/1989 | Waugh | 118/666 |
| 4,822,756 | 4/1989 | Hiraijama | 118/719 |
| 4,835,114 | 5/1989 | Satou et al. | 437/81 |
| 4,962,726 | 10/1990 | Matsushita et al. | 118/715 |
| 5,058,526 | 10/1991 | Matsushita et al. | 118/715 |
| 5,194,397 | 3/1993 | Cook et al. | 437/31 |
| 5,199,994 | 4/1993 | Aoki | 118/715 |
| 5,218,232 | 6/1993 | Yuzurihara et al. | 257/754 |

FOREIGN PATENT DOCUMENTS

| | | |
|---|---|---|
| 813913 | 7/1951 | Germany . |
| 3142548 | 5/1983 | Germany . |
| 2202236 | 9/1988 | United Kingdom . |

OTHER PUBLICATIONS

S. M. Sze, *VLSI Technology*, 1983, pp. 106–107, 350–352.
Arnold Aranson, "Basics of Sputtering Equipment" from *The Book of Basics*, (pre 1988–3rd edition) pp. IV–II–IV–12.
Ryszard Rokicki, "Electropolishing of High Purity Gas Handling Equipment from Metal Finishing" May 1989, pp. 38–39.
Fullin et al, "A Centralized Temperature Control System for Diffusion Furnaces," Solid Sate Technology, Nov. 1972, pp. 40–43, 48.

*Primary Examiner*—Mary Wilczewski
*Assistant Examiner*—Brian K. Dutton
*Attorney, Agent, or Firm*—Finnegan, Henderson, Farabow, Garrett & Dunner, L.L.P.

[57] ABSTRACT

A chemical vapor deposition apparatus comprises a reaction chamber for annealing a silicon wafer, a transportation mechanism for transporting the silicon wafer to the reaction chamber, a detecting device for detecting temperature of the reaction chamber, and an operation control device for receiving signals corresponding to the temperature of the reaction chamber, and supplying to the transportation mechanism, other signals for preventing the silicon wafer from being transported when the temperature is 100° C. or more.

6 Claims, 10 Drawing Sheets

FIG. 15

METHOD OF MANUFACTURING ANNEALED FILMS

This application is a division of application Ser. No. 08/098,245, filed Jul. 29, 1993, now abandoned which is a continuation of application Ser. No. 07/732,762, filed Jul. 19, 1991, abandoned.

BACKGROUND OF THE INVENTION

1. Field of the Invention

This invention relates to a chemical vapor deposition apparatus and a method of manufacturing annealed films, and more particularly to a chemical vapor deposition apparatus and a method of manufacturing annealed films with which a film is deposited on the surface of a semiconductor substrate, which is free from the deposition of an oxide film and the adsorption of impurities.

2. Description of the Related Art

Upon manufacturing a semiconductor device, a polysilicon film, an oxide film, a nitride film or the like which is an element of the semiconductor device is formed on semiconductor substrate by means of a heat treatment apparatus, a chemical vapor deposition apparatus, or the like. In this process, the degree of cleaning of the surface of the semiconductor substrate much affects the characteristics and the reliability of the semiconductor device as a product.

When, for example, a small signal transistor is manufactured, the portion of the substrate in which an emitter region is to be formed is exposed after a base region has been formed, and a polysilicon film is deposited. Then, impurity ions are implanted in the polysilicon film, and an emitter region is formed by diffusing the impurities in a semiconductor substrate by a heat treatment. The temperature, at which a polysilicon film is deposited on a substrate in a reduced pressure chemical vapor deposition apparatus, is around 600° C. In the prior art, therefore, the temperature of the interior of the chemical vapor deposition apparatus is maintained at 600° C. when semiconductor substrates are put in, handled in and taken out of the apparatus. The substrate is exposed to air in the outer atmosphere at a high temperature, and an oxide film of about 0.001 to 0.002 μm is formed on the surface of the substrate. When, therefore, impurity ions are intended to be implanted in the semiconductor substrate by heat treatment, the diffusion of the impurities is suppressed by the oxide film. In consequence, a diffusion layer having a required impurity concentration cannot be obtained and an emitter resistance is increased as well.

In case when a film is formed on a semiconductor substrate, various wafer cleaning processes including physical and chemical ones are used to clean the substrate surface, and careful attention is paid so as not to contaminate the wafers with foreign matter when they are moved from a process to another process.

When, for example, semiconductor substrates are put in a heat treating apparatus and they are taken out of a chemical vapor deposition apparatus (hereinafter referred to as the "CVD apparatus"), an oxide film is sometimes deposited on each substrate. In the conventional heat treatment apparatus which prevents the build-up of the oxide layer, its inlet/outlet portion of semiconductor substrates is isolated from the outer atmosphere. After the atmosphere of the inlet/outlet portion has been evacuated, the substrates are entered in and taken out of the heat treatment apparatus, whereby an oxide layer (a natural oxide layer or the like) which otherwise might be formed by air from the outer atmosphere is prevented from being formed on the semiconductor substrate.

In this way, the prior art heat treatment apparatus can suppress the formation of the oxide film on the semiconductor substrate due to the atmospheric air, but water or the like which has already been adsorbed in the semiconductor substrate cannot be removed. Nor can be removed an oxide layer and/or impurities deposited on the semiconductor substrate during the time interval between the time the remaining oxide layer has been taken away and the time the semiconductor substrate is put in the heat treatment apparatus, and/or impurities such as fluorine adsorbed on the substrate surface.

Upon forming a new film on the substrate of a semiconductor, various means are used to clean the substrate surface to remove, for example, a remaining oxide film, such as a natural oxide film, and impurities existing on the substrate before the new film is formed. Such impurities deteriorate the characteristics and reliability of the semiconductor device.

SUMMARY OF THE INVENTION

The object of this invention is to provide a CVD apparatus and a method of forming annealed film in which a film can be formed on the substrate of a semiconductor without adsorbing an adverse oxide film or impurities on the substrate.

This invention provides a chemical vapor deposition apparatus which comprises a reaction chamber for heat-treating a silicon wafer, a transportation mechanism for transporting the silicon wafer to the reaction chamber, temperature detecting means for detecting the temperature of the reactor, and operation control means for receiving signals corresponding to the temperature of the reaction chamber and supplying to the transportation mechanism other signals for preventing the silicon wafer from being transported when the temperature is 100° C. or more.

The structure of this invention enables a film to be formed on a silicon wafer without adsorbing an oxide film and/or impurities thereon.

An oxide film or impurities are formed on the surface of a silicon wafer in the following cases:

1. in case the silicon wafer is exposed to the outer atmosphere during the transfer of the wafer to the CVD apparatus after a cleaning process such as the removal of an oxide film and/or impurities from the wafer by an aqueous hydrofluoric acid solution has been carried out;

2. in case the silicon wafer which has been transported to the CVD apparatus is being set in the apparatus; and 3. in case the silicon wafer is being annealed in the CVD apparatus.

When the temperature of the reaction chamber begins to be raised to a temperature beyond 100° C. which is the boiling point of water, the chemical reaction takes place easily on the wafer, resulting in the formation of an oxide film thereon. The CVD apparatus according to this invention is intended to prevent the oxidization of the surface of a silicon wafer during the time interval explained in Item 2 and is designed such that control signals which prevent the wafer from being transferred to the CVD apparatus if the temperature of the reaction chamber is 100° C. or more and the signal interrupts the transportation of the wafer to the reaction chamber, whereby the oxide film is hindered from being deposited on the wafer.

This invention also provides a CVD apparatus comprising a reaction chamber for heat-treating a silicon wafer, transporting means for transporting the silicon wafer to the reaction chamber, detecting means for detecting the temperature of the reaction chamber, a high-vacuum pump for evacuating the reaction chamber to a pressure of $5 \times 10^{-5}$ Pa, heating means for heating the reaction chamber, and control means for supplying to the high-vacuum pump, signals which operate the same to evacuate the reactor at the pressure of substantially $5 \times 10^{-5}$ Pa and continuing to supply the heating means further signals for raising the temperature of the reaction chamber to a predetermined value until a cleaned surface appears on the silicon wafer.

The high temperature and high vacuum allow an oxide film (a natural dioxide film, for example) newly deposited on the surface of the silicon wafer and an oxide film and/or impurities such as fluorine to be removed from the substrate such that a cleaned surface appears. The cleaning temperature of the reaction chamber is experimentally found to be 800° to 1,100° C.

The characteristics of the CVD apparatus according to this invention is also applied to the method of manufacturing an annealed film on a silicon wafer. Both the apparatus and the method have the same technical features.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
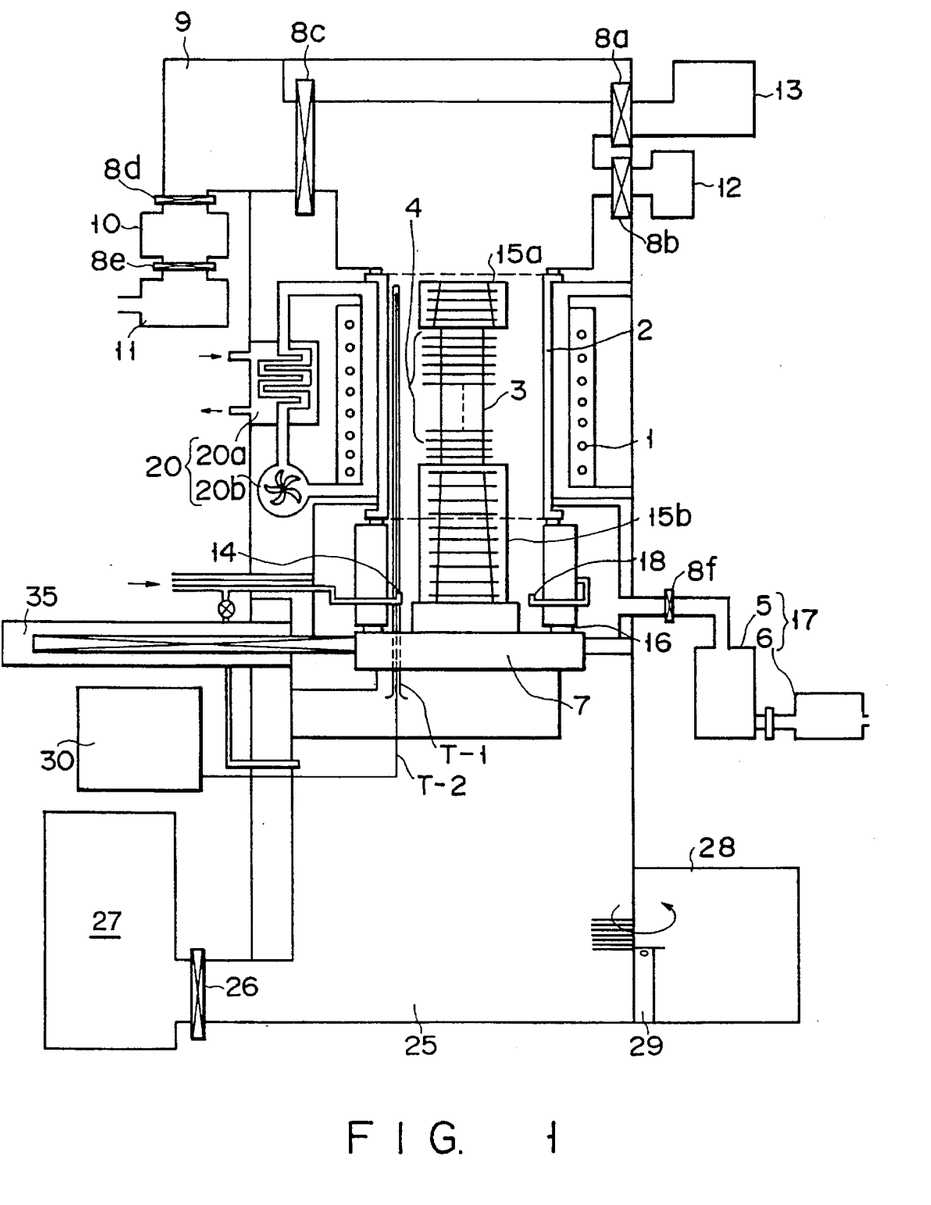
FIG. 1 is a schematic view showing the structure of the first embodiment of a CVD apparatus according to this invention.

FIG. 1 is a schematic view showing the first embodiment of a reduced pressure CVD (chemical vapor deposition) apparatus which is one of annealed film deposition apparatuses. The CVD apparatus is used such that semiconductor substrates 4 loaded on a board 3 are placed in a reaction chamber 2 surrounded by a heater 1. Cooling means 20 is provided for maintaining the temperature in the reaction chamber 2 to 150° C. or less when the semiconductor substrates are put in and taken out of the reaction chamber 2 and for lowering the temperature in the reaction chamber 2 at a rate of 10° C. per minute when the chamber temperature is 500° C. to 100° C. The cooling means 20 comprises a water cooler 20a and a blower 20b. Air cooled by the cooling means 20 passes between the heater 1 and the reactor 2 to cool the reaction chamber 20.

A thermocouple protecting tube and a thermocouple heat sensor are shown by T-1 and T-2, respectively. A controller 30 regulates the operation of the heater 1 and the cooling means 20 in response to a signal corresponding to the temperature of the thermocouple heat sensor T-2 to control the temperature of the reaction chamber 2, and further regulates a valve 35 to control the opening and closing of the inlet/outlet portion of the reaction chamber 2.

A wafer cassette loader 28, a wafer transporting device 29, a load lock chamber 25, a gate valve 26 and a turbomolecular pump 27 are provided as shown.

In order to obtain a high vacuum, the surfaces of a reaction-chamber inlet/outlet flange 7 and metallic exhaust piping which are exposed to the vacuum are electrolytically polished.

Means for maintaining the reaction chamber 2 at a high vacuum of $5 \times 10^{-5}$ Pa or less includes a turbomolecular pump 9, a mechanical booster pump 10, a first exhaust system comprising a dry pump 11, a second exhaust system comprising a cryopump 13 and an ion pump 12, leak preventing means comprising the turbo-molecular pump 5 and the dry pump 6, for preventing leaks between a reaction-chamber inlet/outlet flange 7 and a connection 16 of the reaction chamber 2. Gate valves 8a, 8b, 8c, 8d, 8e and 8f are provided for selectively opening and closing exhaust passages of the exhaust systems. A nozzle 14 is connected to a silane gas cylinder stocker (not shown) and supplies a reaction gas (a silane gas in this embodiment) to the reaction chamber 2. Heat sealing members 15a and 15b are provided over and under the board 3 carrying the semiconductor substrates 4 so as to enlarge the length over which the board 3 is uniformly heated.

Figure 2:
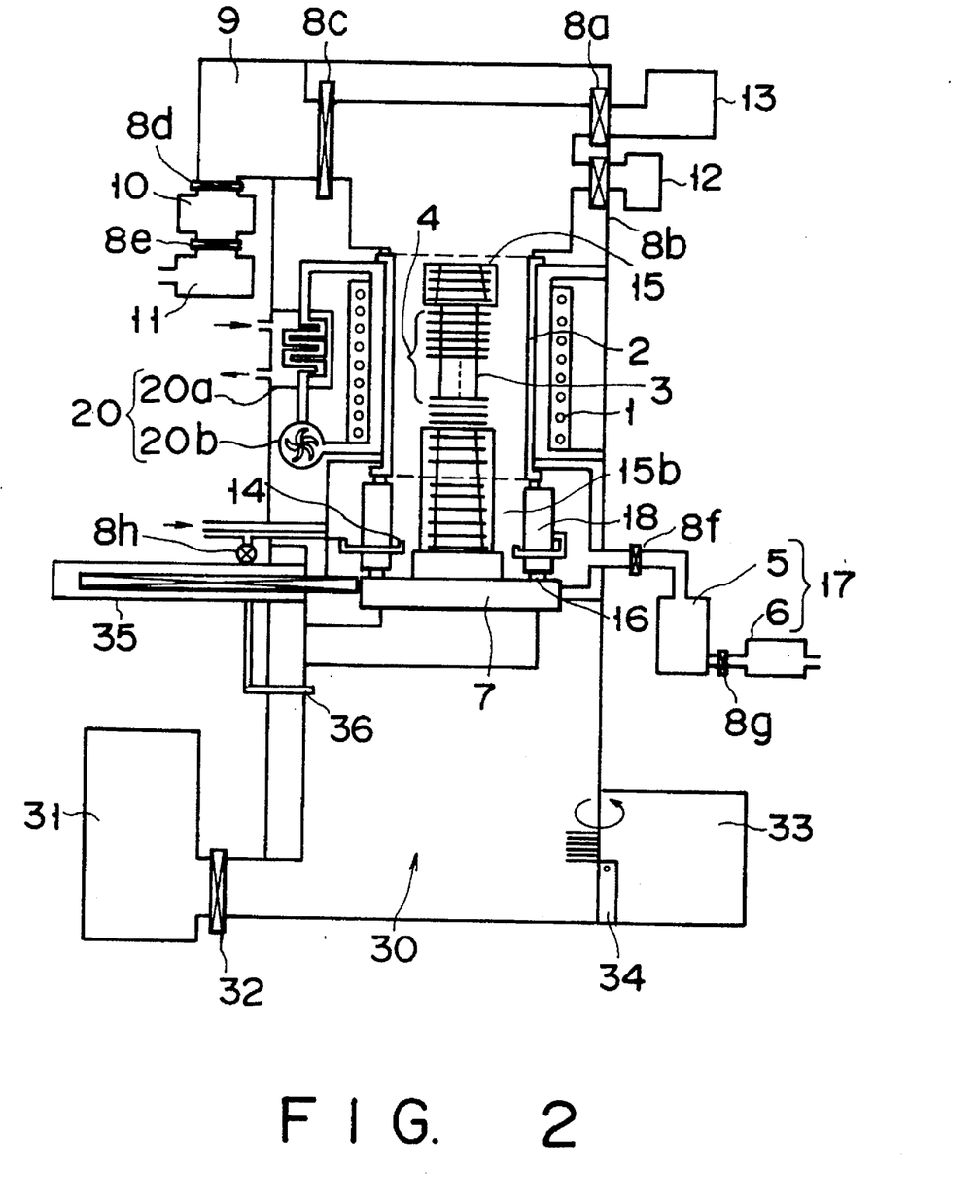
FIG. 2 is a schematic view of the second embodiment of a CVD apparatus according to this invention.

FIG. 2 shows the second embodiment of a CVD apparatus according to this invention which is provided with a load lock chamber 30 having a vacuum means in place of the load lock chamber 30 of the CVD apparatus in FIG. 1. In FIG. 2, the same elements and parts as those of the first embodiment are designated by the same referential numerals as those of the first embodiment, the description thereof being omitted. The vacuum means comprises a turbo-molecular pump 31 and a gate valve 32. Semiconductor substrates 4 are moved by means of a wafer transporting device 34 from a cassette loader 33 to the load lock chamber 30. A gate valve 35 is used to make disconnection between a reaction chamber 2 and the load lock chamber 30 when a reaction-chamber inlet/outlet flange 7 and a board 3 mounted thereon are lowered and put in the load lock chamber 30. If necessary, a reaction gas nozzle 36 is connected to the load chamber 30 and a reaction gas source (not shown) via a gate valve 8h.

Figure 14:
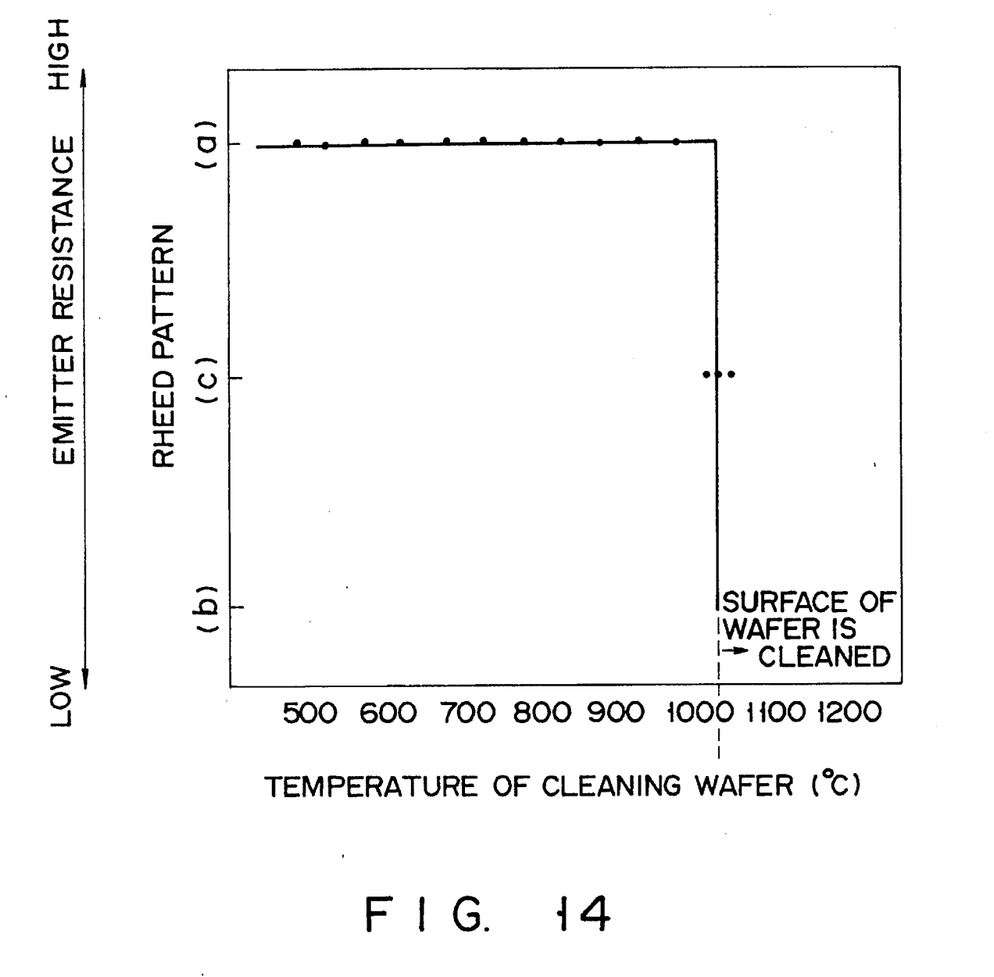
FIG. 14 is a graph showing the relationship between the temperature of the wafer and the emitter resistance.
Figure 15:
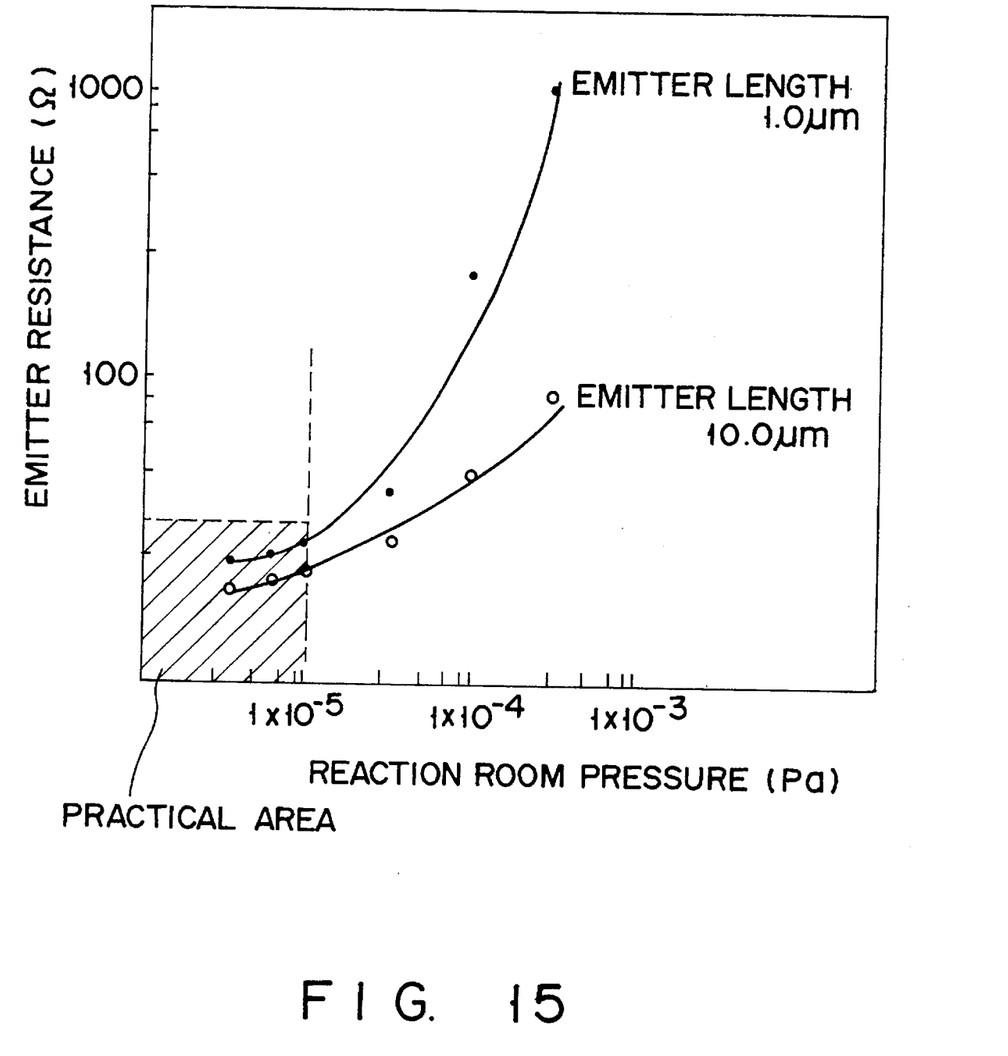
FIG. 15 is a graph showing the relationship between the degree of vacuum and the emitter resistance when impurities are being removed from a silicon wafer.

FIGS. 14 and 15 show the relationship between the wafer temperature taken as the abscissas and emitter resistance taken as the ordinates and the relationship between the degree of vacuum taken as the abscissas and the emitter resistance taken as the ordinates, respectively, when impurities are being removed from the silicon wafer with the apparatus of the second embodiment. As shown at (b) in FIG. 14, the emitter resistance which is much influenced by impurities and/or a dioxide film is abruptly decreased at about 1,020° C. This fact indicates that the temperature in the reaction chamber must also be maintained to a temperature of 1,000° C. or more. FIG. 15 shows the relationships in case of emitter lengths of 1.0 μm and 10 μm. In either case, the emitter resistance is practical usable under a pressure lower than $1 \times 10^{-5}$ Pa.

Figure 3:
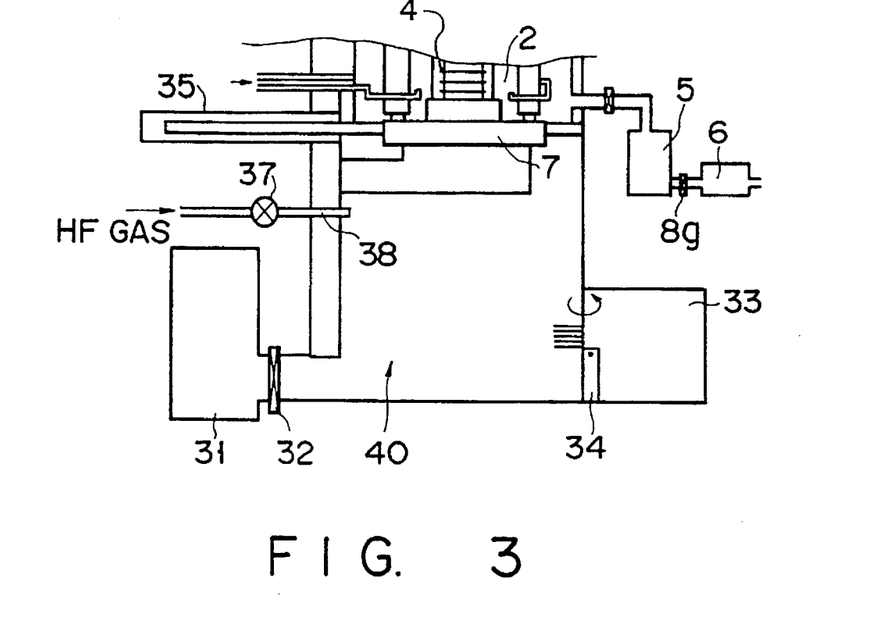
FIG. 3 is a schematic view of a load lock chamber of this invention.

In FIG. 3 is shown the third embodiment of a CVD apparatus according to this invention which is provided with a load lock chamber 40 comprising the load lock chamber 30 in FIG. 2 and a nozzle 38 connected thereto via a gate valve 37 for supplying HF gas for removing an oxide film formed on the surface of a wafer.

The first embodiment of the method of manufacturing annealed films will now be explained with reference to FIG. 1, in which a polysilicon film is formed on a monocrystaline silicon substrate 4.

The temperature in the reaction chamber 2 is lowered to 150° C. or less and the reaction-chamber inlet/outlet flange 7 is moved downward. The board 3 carrying the silicon substrates 4 to be processed is sandwiched between the heat shielding members 15a and 15b, loaded on the flange 7 and put into the reaction chamber 2. The heater 1 is operated to raise the temperature in the reaction chamber 2 and the first exhaust system is actuated to exhaust air in the reaction chamber 2 as well. Leak preventing means 17 comprising the turbo-molecular pump 5 and the dry pump 6 is operated so as to exhaust air in the outer peripheral area of the connection 16 for connecting the flange 7 to the reaction chamber 2. The leak preventing means 17 is provided in order to reduce the pressure difference between the interior of the reaction chamber 2 and the outer peripheral area of the connection 16 thereby preventing air in the outer atmosphere from leaking into the reaction chamber 2 through the connection 16 and thus it is required for maintaining the pressure in the reaction chamber 2 to a high vacuum state.

As the temperature in the reaction chamber 2 is raised by maintaining the vacuum state in the reaction chamber 2 to a required pressure, water adsorbed on the surface of the semiconductor substrate is released. When the degree of vacuum reaches $1 \times 10^{-4}$ Pa and the temperature becomes 400° C. to 450° C., water previously adsorbed on the substrate surface and part of impurities deposited thereon is removed.

The second exhaust system comprising the ion pump 12 and the cryopump 13 is actuated to reduce the pressure in the reaction chamber 2 to $5 \times 10^{-5}$ Pa or less, and the temperature in the reaction chamber 2 is raised 800° C. to 1,100° C. until a clean fresh surface appears on the substrate. The time required for making the surface of the substrate clean in this state cannot always be set to a common specific value because it depends on the thickness of the oxide film, the amount of impurities adsorbed on the substrate surface, heat treating conditions for producing a clean surface. In general, however, it may be about 10 seconds to 1,000 seconds.

After the heat treatment for cleaning, the temperature of the substrate is lowered to a silicon-film deposition temperature of about 620° C. to 640° C. and the gate valves 8a and 8b of the second exhaust system are closed. Thereafter, the film deposition begins. During the time interval between the time when the clean surface is produced on the semiconductor surface and the time when the film deposition pressure (10 to 20 Pa) is obtained, an inert gas can be introduced in the reaction chamber 2 from a gas nozzle 18 such that no impurities are deposited on the substrate surface. The film deposition or film formation is attained by flowing a silane gas ($SiH_4$ gas) from the reaction gas nozzle 14 in a conventional way.

After the film formation, the actuation of the cooling means 20 lowers the temperature in the reaction chamber 2 to 150° C. or less at a rate of 10° C. per minute. While keeping this state, the substrates 4 each formed with a polysilicon film are taken out of the reaction chamber 2 and the film deposition process is completed.

The second embodiment of the method of manufacturing annealed films according to this invention will now be explained with reference to FIG. 2, in which a polysilicon film is also formed on a monocrystaline silicon substrate 4.

Semiconductor substrates 4 are mounted in the cassette loader 33 and the pressure in the load lock chamber 30 is set to the atmospheric pressure. The substrates 4 are moved onto the reaction-chamber inlet/outlet flange 7 in the load lock chamber 30 by means of the wafer transmitting device 34. The load lock chamber 30 is evacuated by opening the gate valve 32 and operating the turbo-molecular pump 31. If required after the exhaust, the gate valve 8h can be opened and part of the reaction gas can be introduced into the reaction chamber 2 from the gas nozzle 36 such that a natural oxide film or the like is previously removed from the surface of the semiconductor substrate 4 in the load lock chamber 30.

The gate valve 35 is opened and the flange 7 is lifted by retaining the reaction chamber 2 in a vacuum state and then the semiconductor substrates 4 are brought into the reaction chamber 2. In this case, the temperature in the reaction chamber 2 is not necessarily set to a value of 150° C. or less. The process, in which the substrates 4 are set in the reaction chamber 2, a polysilicon film is formed or deposited on the surface of each substrate 4 and the temperature in the reaction chamber 2 is set to 150° C. or less, is similar to the process applied to the first embodiment of the film deposition method as mentioned above, the description thereof being omitted. After evacuating the interior of the load lock chamber 30, the flange 7 is lowered. The gate valve 35 is closed to interrupt the communication between the reaction chamber 2 and the load lock chamber 30. The pressure of the load lock chamber 30 is set to the atmospheric pressure and the semiconductor substrates 4 are transferred to the cassette loader 33.

The third embodiment of the method of manufacturing annealed films according to this invention will now be explained with reference to FIG. 3, in which a polysilicon film is also formed on a monocrystalline silicon substrate 4. In this method, substrates 4 are put in the load lock chamber 40 and the chamber is evacuated. From the gas nozzle 38, a gas, such as HF gas, is rendered to flow in the chamber 40 from the gas nozzle 38 to remove a natural oxide film from the surface of the substrate 4. The interior of the load lock chamber 40 is evacuated again, the gate valve 35 is opened and the substrates 4 are placed in the reaction chamber 2. Before the substrates 4 are put in the load lock chamber 40 by means of the cassette loader 33, an inert gas such as nitrogen $N_2$ mixed with a reducing gas such as hydrogen $H_2$, HF, $NF_3$, or HCl can replace air in the load lock 40 so as to avoid the formation of an oxide film on the substrate 4. Each of the reducing gases prevents the formation of a natural oxide film on and the removal thereof from the surface of the substrate 4 prior to the formation of the required annealed film and cools the substrate after the deposition of the intended film.

In the third embodiment of the method of manufacturing annealed films, the temperature for heat-treating substrate is limited to the range within 800° C. to 1,100° C., the description thereof being omitted.

There will be now described the operation of the first embodiment of the apparatus and the third embodiment of the method according to this invention.

The relationship between the temperature in the reaction chamber 2 upon setting the semiconductor substrates 4 in the chamber 4 and the thickness of oxide films formed on the substrates 4 was checked. The measurement of the thickness of the oxide film on each substrate after set in the reaction chamber was made by means of an ellipsometer which is called a deflection spectroscope. When the temperature in the reaction chamber 2 is 150° C. or less, the formation of a new oxide film was not found on the substrate surface. However, as the temperature increased to 200° C., 300° C. and 400° C. in succession, it was confirmed that the thickness of the oxide films was rapidly increased.

The emitter resistance of a plurality of NPN transistors manufactured by a CVD apparatus as shown in FIG. 1 was measured in the reaction chamber 2 by taking, as a parameter, the temperatures T in the reaction chamber 2, and the thickness and the shape of the oxide films formed between the surfaces of monocrystaline silicon substrates and the polysilicon films were investigated from the images of the cross sections of the emitter regions taken under a transmission electron microscope (abbreviated to TEM).

Figure 4A:
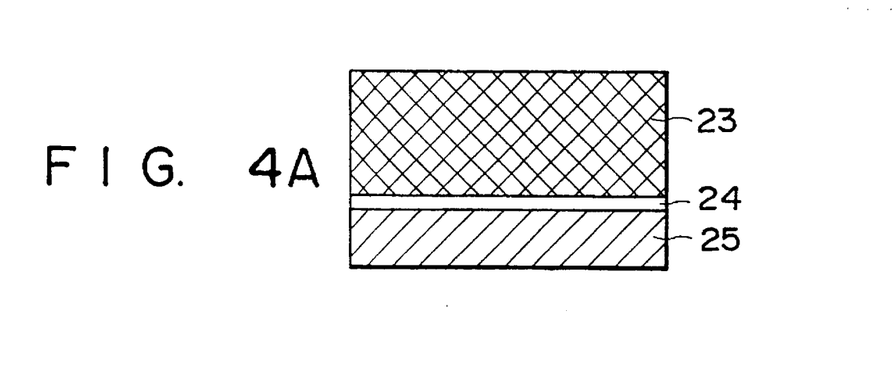
FIGS. 4A and 4B are enhanced representations of images of cross-sectional views of the emitter region of an emitter observed under a TEM (a transmission electron microscope)
Figure 4B:
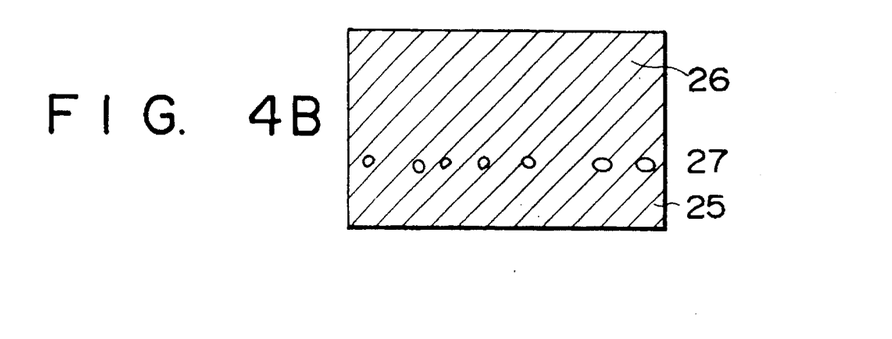

FIGS. 4A and 4B show the enhanced representation of the images of the cross sections of emitter regions taken under the TEM. When the thickness of the oxide film is more than 10 angstroms (10 Å) the film forms a continuous layer 24. When, however, the thickness of the film approaches 10 angstroms, the film is broken into a plurality of balls 27, as shown in FIG. 4B. In other words, so-called ball up appears. In the image of the cross section shown in FIG. 4A, the polysilicon film 23 can be distinguished from the monocrystaline substrate 25. In the image of the cross section shown in FIG. 4B, however, the polysilicon film 26 formed in the region over the balls 27 is a monocrystaline epitaxial layer having the same atomic arrangement as the substrate 25. The film 26 is formed continuously with the substrate 25 through the areas between the balls.

Figure 5:
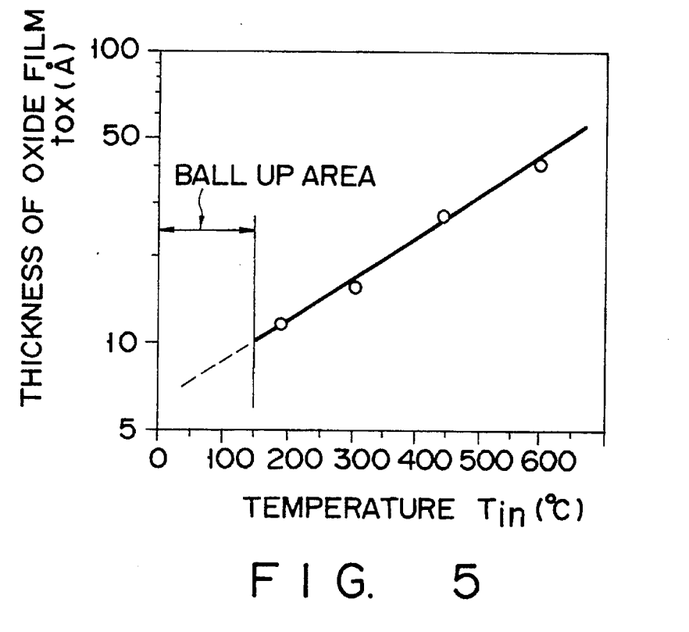
FIG. 5 is a diagram showing the relationship between the temperature of a reaction chamber and the film thickness of a substrate set in the reaction chamber.

FIG. 5 shows an example of the relationship between the $T_{in}$ temperature (the abscissa) in the reaction chamber and the thickness $t_{ox}$ (the ordinate) of the oxide films formed between substrates and polysilicon films. As the temperature $T_{in}$ falls, the thickness $t_{ox}$ becomes thinner. Although the critical temperature BT in at which ball up occurs varies to some extent, it always takes place at a temperature of 150° C. or less.

Figure 6:
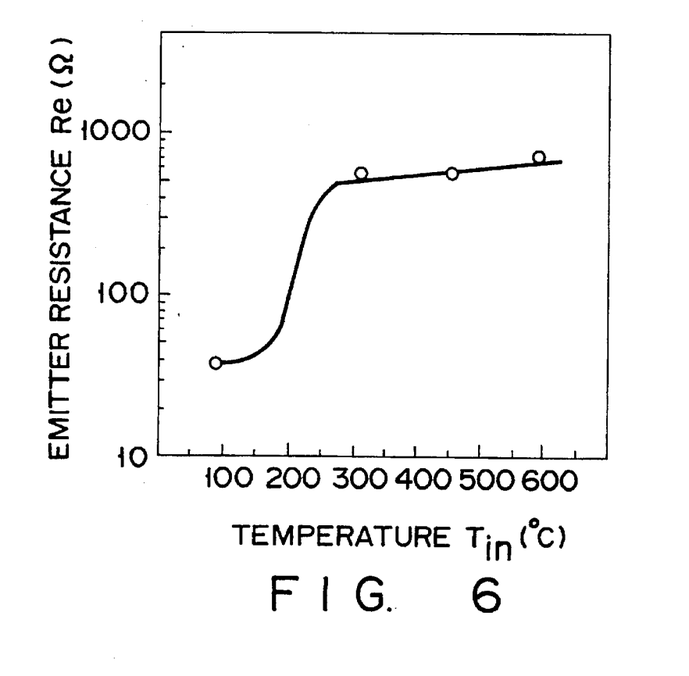
FIG. 6 is a diagram showing the relationship between the temperature of the reaction chamber and the emitter resistance.

FIG. 6 shows the relationship between the temperature $T_{in}$ and the emitter resistance Re. Re is such a high resistance as several hundred ohms for $T_{in}$ of 200° C. or more, but it is reduced to several ten ohms when $T_{in}$ is 150° C. or less. When $t_{in}$ is 200° C. or more, the oxide film is continuous as shown in FIG. 4A. In the next emitter diffusion process, doner impurities are prevented by the oxide layer from being diffused in the emitter region, thereby presenting high emitter resistance. On the other hand, when T in is lower than the critical temperature of 150° C., ball up occurs in the oxide film, and the polysilicon film constituting an emitter electrode forms a monocrystaline silicon region joined to the emitter region of the substrate. Consequently, the doner impurities having a required concentration are diffused in the emitter region. Further, since an oxide film which blocks carriers does not exist, the emitter resistance is reduced stepwise.

Figure 11:
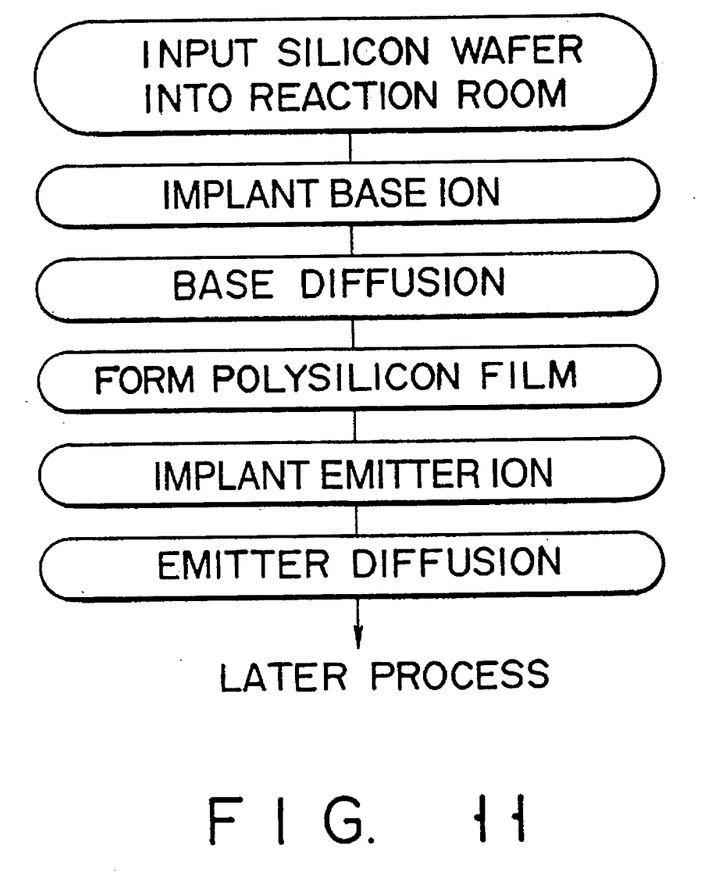
FIG. 11 shows an outline of part of the process of forming a base region and an emitter region on a wafer for a small signal transistor.
Figure 12:
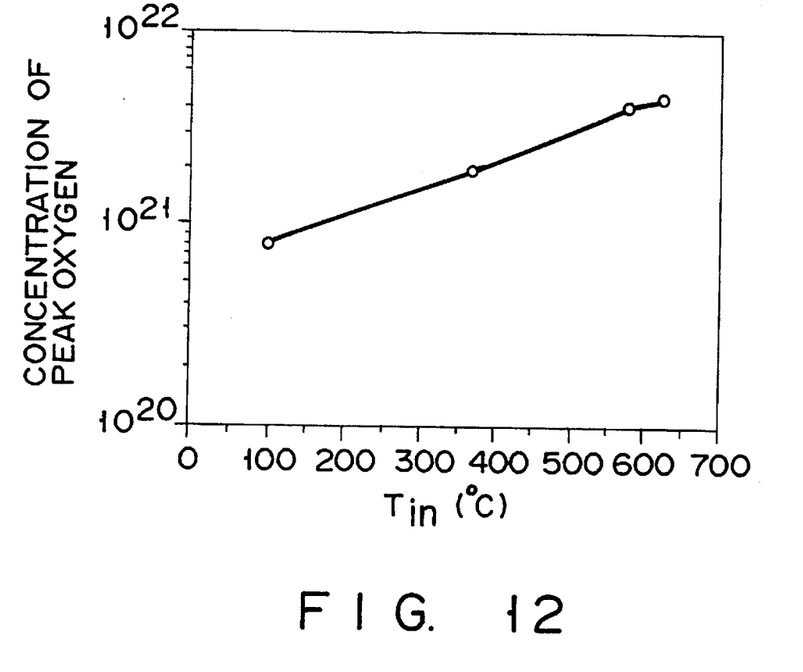
FIG. 12 is a graph showing the relationship between the temperature of the small signal transistor and the maximum oxide concentration of the surface oxide film of the transistor.

It is necessary to set the substrates in the reaction chamber by keeping the temperature in the chamber to 150° C. or less, taking into consideration the results from the above-mentioned experiments and the experiments based on FIGS. 11 and 12 and the heat treatment conditions for cleaning the surface of the substrate.

The reason why the temperature in the reaction chamber is raised at a rate of 10° C. per a minute is that an oxide film is not easily formed on the substrate by water adsorbed thereon when the temperature is being raised at this rate.

The cooling means 20 is used to shorten the time for lowering the temperature in the reaction chamber from a high temperature to 150° C. or less. In particular, from 500° C. at which the difference of temperature between the reaction chamber and its surroundings starts to become small, the temperature is reduced at a rate of 10° C. or less. This step suppresses the change of the impurity condensation profile and prevents the lowering of productivity.

There will now be described how the heat treatment conditions such as the degree of vacuum in the reaction chamber of $5 \times 10^{-5}$ Pa or less and the temperature of the silicon substrate of 800° C. to 1,100° C. were obtained. The CVD apparatus as shown in FIG. 1 and the first embodiment of the method of this invention were used. When the heat treatment for cleaning the surfaces of substrates was carried out after the substrates had set in the reaction chamber, the heat treatment conditions were changed. The states of the substrate surfaces were observed by means of an RHEED apparatus (a reflection high energy electron diffraction apparatus) provided in the reaction chamber, and the conditions under which clean surfaces appeared were found.

Figure 7A:
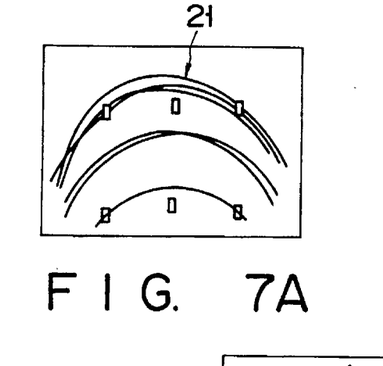
FIGS. 7A to 7C are RHEED patterns (reflection high energy electron diffraction patterns) showing the states of the surface of a silicon wafer.
Figure 7B:
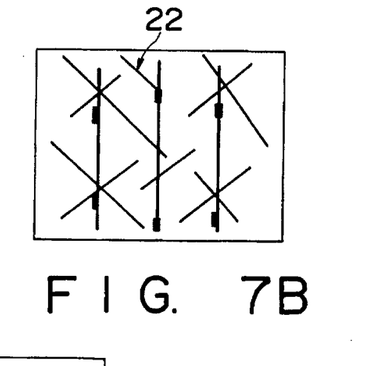
Figure 7C:
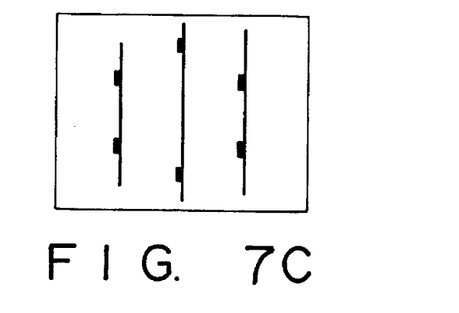

FIG. 7A shows a RHEED pattern in which a cleaned substrate surface has not yet appeared because the heat treatment for cleaning has not yet carried out or the heat treatment conditions have not yet been satisfied. Debey rings 21 are seen in the pattern. FIG. 7B shows a RHEED pattern in which the heat treatment conditions are satisfied and a clean surface of a substrate appears. Kikuchi lines 22 showing that the clean surface is a monocrystalline silicon surface are observed. FIG. 7C shows a RHEED pattern just after forming a polysilicon film on the clean surface as shown in FIG. 7B according to the above-mentioned heat treatment. It is found that the polysilicon film is directed in the same crystal orientation as the silicon substrate. Based on the RHEED patterns as shown in FIGS. 7A to 7C, judgment was made whether clean surfaces appeared on silicon substrates and the above-mentioned heat treatment conditions were obtained.

The heat treatment conditions for cleaning GaAs substrates were obtained by employing a method very similar to the above-mentioned method. It was found that clean surfaces appeared on GaAs substrates by raising the temperature of substrates to 500° C. to 600° C.

Figure 8:
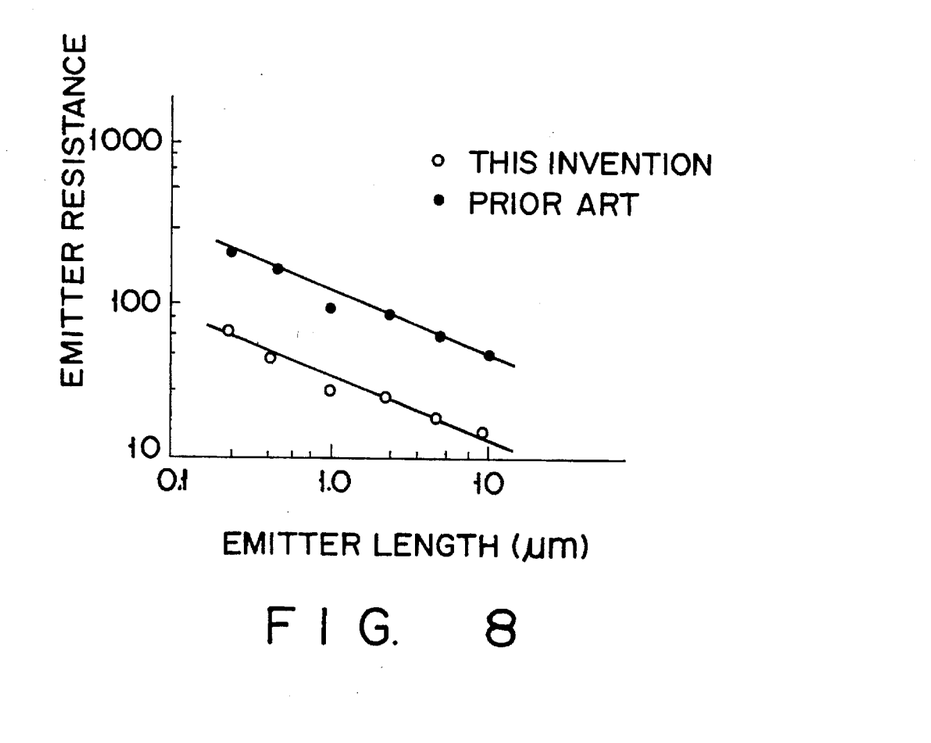
FIG. 8 shows the dependency of the emitter length on the emitter resistance of transistors of this invention and of the prior art.

The explanation will now be made how the first embodiment of the CVD apparatus and the first method of this invention are applied to the manufacture of NPN transistors. A polysilicon film is deposited on a region of a silicon substrate in which an emitter is to be formed according to the first method of this invention. As ions are implanted to the silicon substrate at a dose of $2 \times 10^{16}$ atoms/cm$^2$ and at an acceleration voltage of 50 keV and diffused into an emitter region. FIG. 8 shows the relation between the emitter resistance and the emitter length of NPN transistors manufactured by the method of this invention and by the conventional method. The abscissa represents the emitter length in μm and the ordinate, the emitter resistance in Ω. The width of the emitters is 0.5 μm (constant). White round marks show the data of polysilicon films formed by the first embodiment of the apparatus and the first embodiment of the method of this invention and black round marks indicate the data of polysilicon films formed by the prior art. It is apparent from FIG. 8 that the emitter resistance obtained by this invention is reduced to about one-fourth (¼) of the conventional emitter resistance.

Figure 9A:
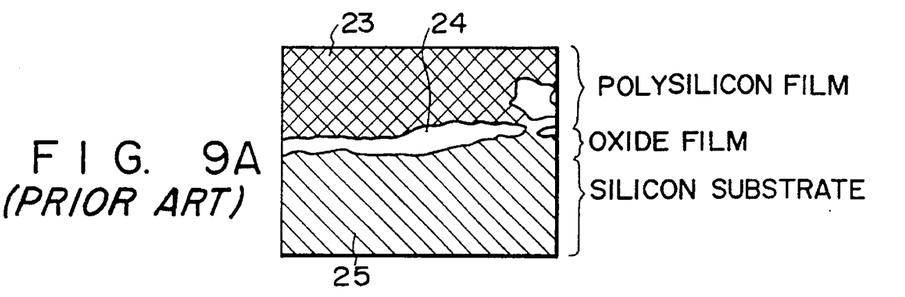
FIGS. 9A and 9B are enhanced representations of the TEM images of cross sections of the emitter regions of the transistors.
Figure 9B:
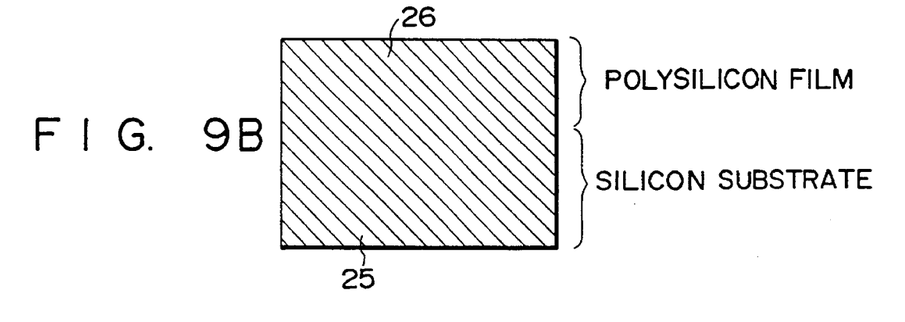

The state of the boundary between the monocrystaline silicon substrate and the polysilicon film of each NPN transistor manufactured according to this invention was checked by taking images cross sections of the transistors under a TEM (a transmission electron microscope) having a high resolving power. FIGS. 9A and 9B respectively show enhanced representations of images of the cross sections of conventional NPN transistors and transistors manufactured according to the first method of this invention. From FIG. 9B, it is found, in the NPN transistor manufactured according to this invention, that no natural oxide film is present between the polysilicon film 26 and the silicon substrate 25. However, it is seen, in the conventional NPN transistor, that an oxide film 24 of about 0.001 μm exists between the polysilicon film 23 and the silicon substrate 25. When a polysilicon film is formed on a silicon substrate by using the first embodiment of the apparatus and the first embodiment of the method of this invention, an oxide film is not formed or the formation of an oxide film can be much suppressed. Further, impurities such as carbon, fluorine or the like are not present on the boundary surface. In consequence, a device having low emitter resistance is manufactured.

In place of a polysilicon film, an SiO$_2$ film, an SiN$_x$ film, or a film made of other material may be deposited on a monocrystalline silicon substrate by using the apparatus and the method of this invention. A silicon substrate may be replaced by a GaAs substrate.

A further embodiment of the method of manufacturing annealed films will now be explained with reference to FIG. 10 which shows a schematic structure of a normal pressure CVD apparatus. A bell jar 41 made of quartz has a lift (not shown) and is placed on a base plate 42 in a close contact state. In the reaction chamber 41a of the bell jar 42 is provided a planar susceptor (wafer loader) 44 which is made of graphite and carries a plurality of semiconductor substrates 43. The planar susceptor 44 is heated by means of an RF heater (a radio-frequency heater) 45 and is rotated around its own axis. On the top of the bell jar 41 are formed a reaction gas supplying nozzle 46 and a non-oxidizing gas supplying nozzle 47. In the base plate 42 is provided an exhaust port 48 connected to forcing exhaust means or natural exhaust means (not shown).

Figure 10:
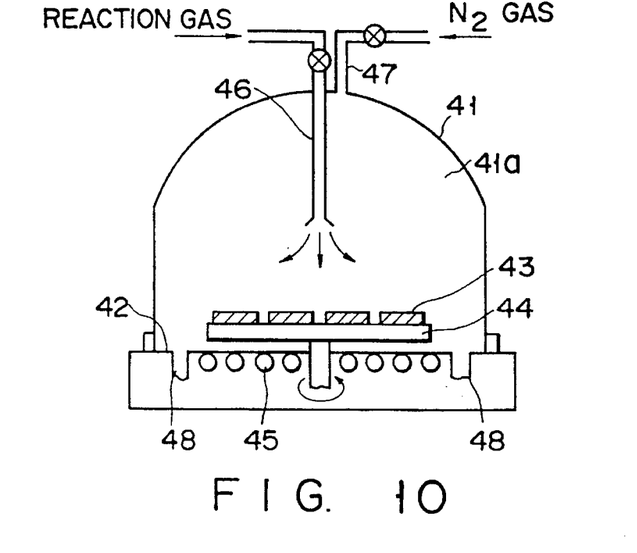
FIG. 10 is a schematic view of a normal pressure CVD apparatus used for forming annealed films according to this invention.

The method by using the apparatus as shown in FIG. 10 will now be explained. The temperature of the planar susceptor 44 is held to 150° C. or less, for example, 100° C. If required, N$_2$ gas is conducted into the reaction chamber 41a from the nozzle 47 to cool the planar susceptor 44. The bell jar 41 is lifted so as to load semiconductor substrates 43 to be processed on the susceptor 44. N$_2$ gas is caused to flow into the reaction chamber 41a such that the chamber is filled with the gas. Then, the bell jar 41 is lowered to closely contact the base plate 42. The interior of the reaction chamber 41a is disconnected from the outer atmosphere. As the N$_2$ is made to flow, the RF heater 45 is operated to increase the temperature to about 600° C. at a rate of 10° C./min or more. The reaction gas supplying nozzle 47 is closed and the non-oxidizing gas supplying nozzle 46 is opened. As the reaction gas (a carrier gas comprising SiH$_4$ and N$_2$) is introduced into the reaction chamber 41a, the susceptor 44 is rotated. A polysilicon film having a thickness of about 0.4 μm is formed on the substrate 43. The gas introduced into the reaction chamber 41a is changed from the SiH$_4$-N$_2$ gas mixture to N$_2$ gas to cool the substrates, etc. Thereafter, the bell jar 41 is lifted and the substrate 43 are taken out of the reaction chamber 41a. As N$_2$ gas, highly pure N$_2$ which does not include water, etc. is used. However, it may be mixed with H$_2$ or the like and used as a reducing gas.

The method of forming polysilicon films by using the normal pressure CVD apparatus can be applied to the wafers of small-signal transistor devices, for example. FIG. 11 shows a flow chart of a wafer process for forming a polysilicon film of a single signal transistor. An N type epitaxial layer is deposited on a silicon wafer. The portion of the wafer on which a base region is to be formed is exposed and boron ions B$^+$ are implanted therein. The boron ions are thermally diffused into the wafer and the base region is formed. Thereafter, the portion of the wafer on which an emitter region is to be formed is exposed to form a polysilicon film having a thickness of 0.4 μm by using the method of this invention as shown in FIG. 11. Finally, As ions are implanted at 50 keV and $4 \times 10^{16}$ atoms/cm$^2$. Heat treatment is carried out in an N$_2$ atmosphere for thirty minutes to diffuse As ions into the substrate. In this way a transistor is manufactured.

The explanation will now be made how the method of this invention using a normal pressure CVD apparatus as shown in FIG. 10 has been developed.

With the normal pressure CVD apparatus as shown in FIG. 10, a plurality of NPN transistors were manufactured by setting the temperature of the susceptor 44, on which substrates are loaded, to various values. The so manufactured transistors were analyzed to measure maximum oxygen concentration (peak oxygen concentration) between the emitter diffused region and the polysilicon film (which constitutes an emitter source and an emitter electrode) of each transistor by means of a SIMS method (a secondary ion mass spectrometry method) and also to measure sheet resistance $\rho_s$ of the emitter diffusion layer of each transistor.

FIG. 12 shows the relationship between the temperature $T_{in}$ of the susceptor on which a set of substrates are loaded and the maximum oxygen concentration (peak oxygen concentration) of the surface oxide films. As $T_{in}$ increases, the maximum oxygen concentration increases rapidly in an exponential fashion, but its increase is uniform and continuous.

Figure 13:
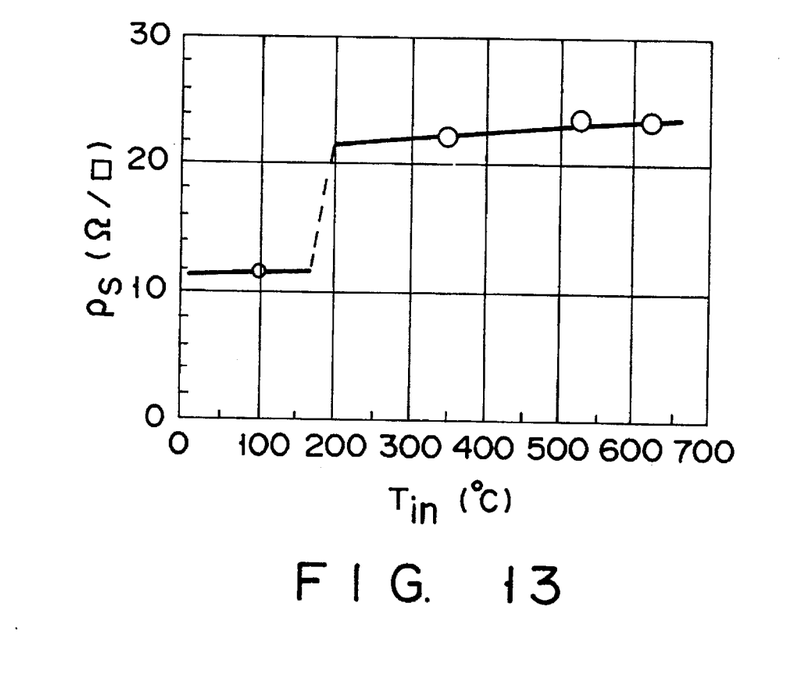
FIG. 13 is a graph showing the relationship between the temperature of the transistor and the emitter diffusion layer thereof.

FIG. 13 shows the relationship between the temperature $T_{in}$ and the sheet resistance $\rho_s$ ($\Omega/\square$) of the emitter regions. It is considered that the smaller $\rho_s$ is, the more doner impurities are implanted. In other words, the smaller $\rho_s$ is, the smaller the barrier of the surface oxide film is. It is observed that $\rho_s$ is reduced in a step fashion at a temperature between 150° C. and 200° C.

The maximum oxygen concentration in FIG. 12 mainly shows the volume of the oxide film within the measured area. $\rho_s$ in FIG. 13 relates to the degree of diffusion of doner impurities in the emitter region and is greatly influenced by the shape of the surface oxide film. It is considered that the stepwise reduction of $\rho_s$ is produced by the occurrence of the ball up as explained above. In this respect, it is necessary to set the substrates on the susceptor by keeping the temperature in the reaction chamber to 150° C. or less. The experiments for determining the thickness of the oxide films and the emitter resistance in FIGS. 5 and 6 were carried out by using the reduced pressure CVD apparatus of FIG. 1 and the experiments for determining the maximum oxygen concentration and $\rho$ in FIGS. 12 and 13 were performed by employing the normal pressure CVD apparatus. Since the substrates were exposed to the outer atmosphere when they were set in the reaction chamber in either case, both experiments were equivalent to each other.

When a polysilicon film is formed on a silicon substrate by using the method in FIG. 11, the thickness of the surface oxide film is reduced and ball up occurs. Thus, the impurities are securely diffused in the substrate in the next emitter diffusion process.

As described in detail, this invention provides a CVD apparatus and a method of manufacturing thermally annealed films in which a film can be formed on a semiconductor substrate when a clean surface without the adsorption of an oxide film and/or impurities thereon appears and the change of the impurity concentration profile is suppressed. This invention further provides a method of manufacturing thermally annealed films in which a natural oxide film between the substrate and the polysilicon film is removed and the impurities ion-implanted in the polysilicon film can be securely diffused in the substrate in the next process.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing thermally annealed films, comprising the steps of:

decreasing internal temperature of a furnace to 150° C. or less;

inserting a semiconductor wafer into the furnace;

increasing the internal temperature of the furnace to a first temperature;

reducing internal pressure of the furnace to a first pressure;

decreasing the internal temperature for a second time to a second temperature necessary for forming a reaction film, the second temperature being higher than the first temperature;

increasing the internal pressure of the furnace to a second pressure;

forming the reaction film after the internal temperature of the furnace is decreased to the second temperature and the internal pressure of the furnace is increased to the second pressure;

then decreasing the internal temperature of the furnace for a third time to 150° C. at a rate of 10° C. or more/min.; and removing the semiconductor wafer from furnace after the internal temperature of the furnace is decreased to 150° C.

2. A method according to claim 1, wherein the first temperature is within 400° to 500° C., and the first pressure is within $10^{-4}$ Pa.

3. A method according to claim 1, wherein the first temperature is within 800° to 1000° C., and the first pressure is within $5\times10^{-5}$ Pa.

4. A method according to claim 1, wherein the second temperature is within 620° to 640° C., and the second pressure is within 10 to 20 Pa.

5. A method according to claim 1, wherein the second temperature-decreasing step includes a step of supplying inert gas into the furnace.

6. A method according to claim 5, wherein the gas includes silane gas.

* * * * *